United States Patent
Jung et al.

(10) Patent No.: US 9,610,751 B2
(45) Date of Patent: Apr. 4, 2017

(54) DISPLAY DEVICE HAVING CUSHION PAD

(71) Applicant: SAMSUNG DISPLAY CO., LTD., Yongin, Gyeonggi-Do (KR)

(72) Inventors: Youn-Hwan Jung, Hwaseong-si (KR); Tae-Eun Kim, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/523,022

(22) Filed: Oct. 24, 2014

(65) Prior Publication Data

US 2015/0282336 A1 Oct. 1, 2015

(30) Foreign Application Priority Data

Mar. 28, 2014 (KR) ........................ 10-2014-0036492

(51) Int. Cl.
*H01L 21/31* (2006.01)
*H05B 33/04* (2006.01)
*H01M 2/02* (2006.01)
*H01L 33/62* (2010.01)
*B32B 15/08* (2006.01)
(Continued)

(52) U.S. Cl.
CPC .............. *B32B 15/08* (2013.01); *B32B 7/02* (2013.01); *B32B 7/12* (2013.01); *B32B 15/043* (2013.01); *B32B 15/18* (2013.01); *B32B 15/20* (2013.01); *B32B 27/20* (2013.01); *B32B 27/281* (2013.01); *B32B 27/286* (2013.01); *B32B 27/308* (2013.01); *B32B 27/32* (2013.01); *B32B 27/36* (2013.01); *B32B 27/38* (2013.01); *H01L 51/524* (2013.01); *B32B 2255/205* (2013.01); *B32B 2307/306* (2013.01); *B32B 2307/41* (2013.01); *B32B 2307/412* (2013.01); *B32B 2307/414* (2013.01); *B32B 2307/56* (2013.01); *B32B 2457/20* (2013.01); *G02F 2001/133314* (2013.01); *G02F 2201/503* (2013.01);
(Continued)

(58) Field of Classification Search
CPC .. H01L 51/50; H01L 51/5243; H01L 51/5221
USPC .......... 264/334; 257/43, 99, E33.066; 438/3; 428/215, 332
See application file for complete search history.

(56) References Cited

U.S. PATENT DOCUMENTS

2005/0058852 A1* 3/2005 Tyan .................. H01L 51/5036
428/690
2007/0188087 A1* 8/2007 Kwon et al. ................. 313/506
(Continued)

FOREIGN PATENT DOCUMENTS

KR        2009-0035155     4/2009
KR        10-2009-0070652  7/2009
(Continued)

OTHER PUBLICATIONS

"Mohs hardness scale—testing the resistance to being scratched", http://geology.com/minerals/mohs-hardness-scale.shtml.*

*Primary Examiner* — Brian Turner
(74) *Attorney, Agent, or Firm* — Lee & Morse P.C.

(57) ABSTRACT

A display device includes a case having an accommodating space, a cushion pad on one surface of the accommodating space of the case, and a display panel on the cushion pad. The cushion pad includes a metal layer, a hard material layer on the metal layer, and an elastic layer on the hard material layer. The hard material layer has a hardness greater than a hardness of the metal layer.

22 Claims, 5 Drawing Sheets

(51) Int. Cl.
*B32B 15/04* (2006.01)
*B32B 7/02* (2006.01)
*B32B 7/12* (2006.01)
*B32B 15/18* (2006.01)
*B32B 15/20* (2006.01)
*B32B 27/20* (2006.01)
*B32B 27/28* (2006.01)
*B32B 27/30* (2006.01)
*B32B 27/32* (2006.01)
*B32B 27/36* (2006.01)
*B32B 27/38* (2006.01)
*H01L 51/52* (2006.01)
*G02F 1/1333* (2006.01)

(52) U.S. Cl.
CPC ... *H01L 51/5256* (2013.01); *Y10T 428/12562* (2015.01); *Y10T 428/24983* (2015.01)

(56) References Cited

U.S. PATENT DOCUMENTS

| | | | | |
|---|---|---|---|---|
| 2009/0025215 | A1* | 1/2009 | Murakami et al. | 29/846 |
| 2011/0192499 | A1* | 8/2011 | Thete | 148/278 |
| 2011/0317121 | A1* | 12/2011 | Lin | G02F 1/133512 349/158 |
| 2012/0228667 | A1* | 9/2012 | Boerner | 257/99 |
| 2013/0207541 | A1* | 8/2013 | Bouten | H01L 51/525 313/512 |

FOREIGN PATENT DOCUMENTS

| | | |
|---|---|---|
| KR | 10-2012-0117214 | 10/2012 |
| KR | 10-2013-0099799 | 9/2013 |

* cited by examiner

DISPLAY DEVICE HAVING CUSHION PAD

CROSS-REFERENCE TO RELATED APPLICATION

Korean Patent Application No. 10-2014-0036492, filed on Mar. 28, 2014, in the Korean Intellectual Property Office, and entitled: "Display Device Having Cushion Pad," is incorporated by reference herein in its entirety.

BACKGROUND

1. Field

Embodiments relate to a display device including a cushion pad.

2. Description of Related Art

Recently, flexible display devices that may be bent have been developed. The flexible display device may be utilized in a folded or curved state in various applications. The flexible display panel may have a display element arranged on a flexible substrate. There are various kinds of displays, for example, an organic light emitting diode (OLED), a liquid crystal display (LCD), an electrophoretic display (EPD), and the like. Among these, the OLED is drawing attention as suitable for a flexible display device, as it may be manufactured to have a thin film laminated structure, which in turn may impart flexibility.

SUMMARY

Embodiments are directed to a display device that includes a case having an accommodating space, a cushion pad on one surface of the accommodating space of the case, and a display panel on the cushion pad. The cushion pad includes a metal layer, a hard material layer on the metal layer, and an elastic layer on the hard material layer. The hard material layer has a hardness greater than a hardness of the metal layer.

The elastic layer may have a hardness lower than a hardness of the display panel. The elastic layer may have a hardness lower than the hardness of the hard material layer. The elastic layer may have a Mohs hardness in a range of from about 0.1 to about 1.5. The metal layer may have a Mohs hardness of less than about 4.5. The metal layer may include at least one of aluminum, gold, silver, copper, zinc, and lead. The hard material layer may have a hardness of about 4.5 or more on the Mohs scale. The hard material layer may include carbon steel. The hard material layer may include stainless steel. The elastic layer may include polymer resins. The elastic layer of the cushion pad faces the display panel and is proximate thereto. The display device may include an adhesive layer on the elastic layer.

A cushion pad includes a metal layer, a hard material layer on the metal layer, and an elastic layer on the hard material layer. The hard material layer has a hardness greater than a hardness of the metal layer. The metal layer may have a hardness of less than about 4.5 on the Mohs scale. The metal layer may include at least one of aluminum, gold, silver, copper, zinc, and lead. The hard material layer may have a hardness of about 4.5 or more on the Mohs scale. The hard material layer may include carbon steel. The hard material layer may include stainless steel. The elastic layer may include polymer resins. The cushion pad may include an adhesive layer on the elastic layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
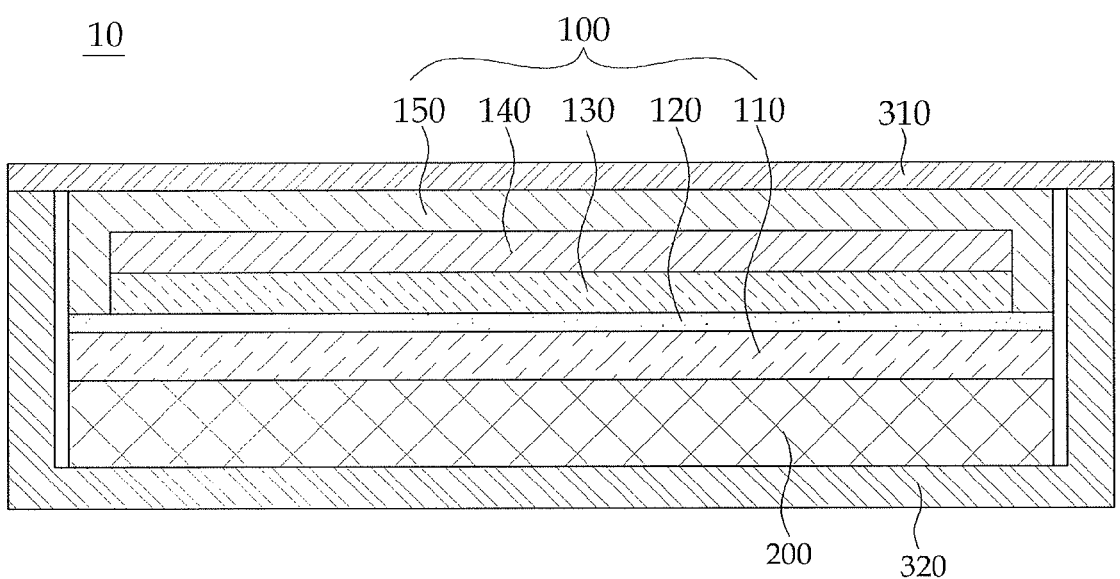
FIG. 1 illustrates a cross-sectional view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided such that this disclosure will be thorough and complete, and will fully convey exemplary implementations to those skilled in the art.

Each element and its shape may be schematically or exaggeratedly illustrated to help understanding of the disclosure. Like reference numerals refer to like elements throughout. When an element is referred to as being "on" or "over" another element, it may be directly on or over the other element or intervening elements may also be present. Further, the use of "may" when describing embodiments may refer to one or more embodiments.

FIG. 1 illustrates a cross-sectional view of a display device 10 according to an embodiment. As illustrated in FIG. 1, the display device 10 may include a display panel 100, a window 310 proximal a display surface of the display panel 100 and protecting the display panel 100, a lower case 320 coupled to the window 310 having an accommodating space, and a cushion pad 200 supporting the display panel 100 and acting as a buffer between the display panel 100 and the lower case 320. The lower case 320 may act as a case to accommodate the display panel 100. The cushion pad 200 may be on one surface of the accommodating space of the lower case 320, and the display panel 100 may be on the cushion pad 200. The display device 10 illustrated in FIG. 1 includes an organic light emitting panel as the display panel 100.

Figure 2:
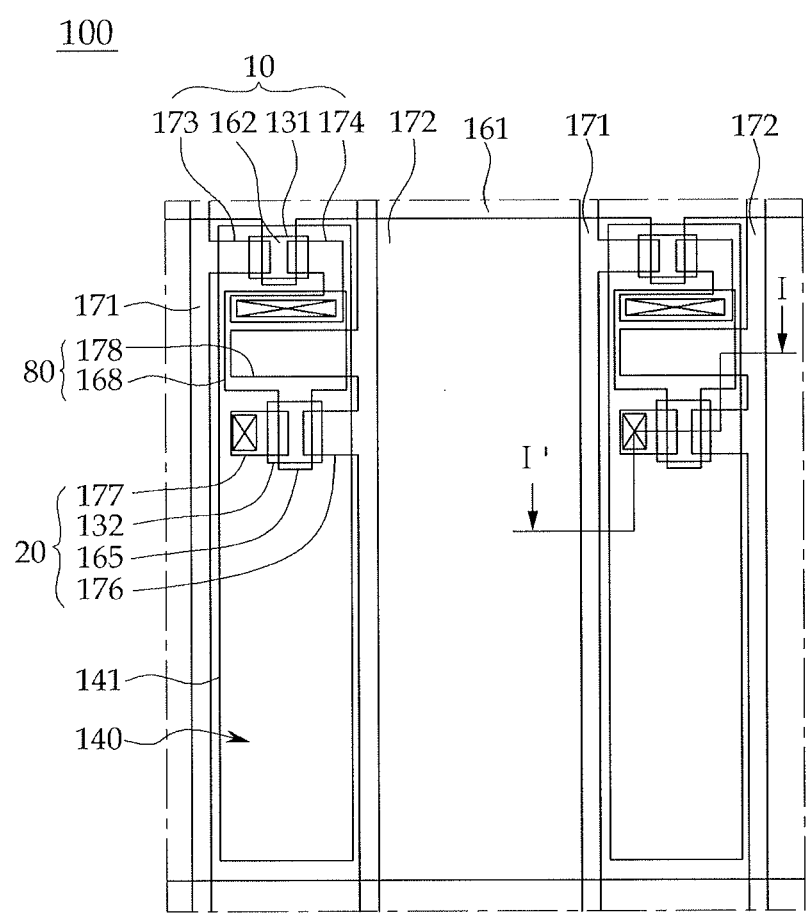
FIG. 2 illustrates an enlarged plan view of an internal structure of a display panel of the display device illustrated in FIG. 1.
Figure 3:
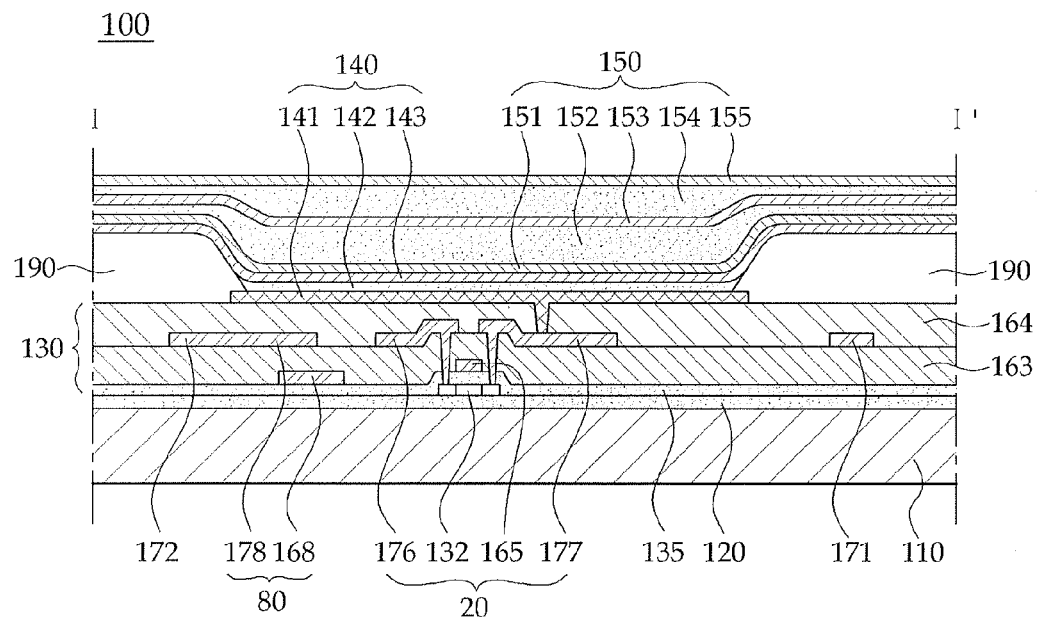
FIG. 3 illustrates a cross-sectional view taken along the line I-I' in FIG. 2.

The organic light emitting panel 100 serving as a display panel is described with reference to FIGS. 2 and 3. FIG. 2 illustrates an enlarged plan view of an internal structure of the organic light emitting panel 100 and shows a pixel structure. FIG. 3 illustrates a cross-sectional view taken along the line I-I' in FIG. 2. The organic light emitting panel 100 illustrated in FIGS. 2 and 3 is a type of flexible display panel, and may include a flexible substrate 110, a driver circuit 130, an organic light emitting diode (OLED) 140, and a thin film encapsulation layer 150. The organic light emitting panel 100 may further include a buffer layer 120 and a pixel defining layer (PDL) 190.

The flexible substrate 110 may include a flexible material such as plastic. The flexible substrate 110 may include, for example, one or more of a KAPTON® material, a polyethersulphone (PES), a polycarbonate (PC), a polyimide (PI), a polyethyleneterephthalate (PET), a polyethylenenaphthalate (PEN), a polyacrylate (PAR), and a fiber reinforced plastic (FRP). For example, polyimide (PI) is a suitable material for the flexible substrate 110 that may undergo thermal processes, the polyimide having utility in thermal resistance.

The buffer layer 120 may be on the flexible substrate 110 and may include one or more layers selected from various suitable inorganic and organic layers. The buffer layer 120 may reduce or prevent unnecessary components such as impurities or moisture from infiltrating into the driver circuit 130 or the OLED 140, and may planarize a surface. The buffer layer 120 may be omitted, for example, depending on kinds and process conditions of the flexible substrate 110.

The driver circuit 130 may be on the flexible substrate 110. The driver circuit 130 may include thin film transistors (TFTs) 10 and 20 (FIG. 2) and drive the OLED 140 serving as a display element. The OLED 140 serving as a display element may emit light according to driving signals received from the driver circuit 130 such that an image is displayed.

Although certain structures of the driver circuit 130 and the OLED 140 are illustrated in FIGS. 2 and 3, other structures may be used. The driver circuit 130 and the OLED 140 may be embodied in any suitable form. Although FIGS. 2 and 3 illustrate an active-matrix organic light emitting panel 100 with a 2Tr-1Cap structure, which includes two TFTs 10 and 20 and a capacitor 80 in one pixel, different numbers of TFTs and/or capacitors may be used. For example, a display device 10 according to an embodiment may include three or more TFTs and two or more capacitors in one pixel, and may further include lines. The display device 10 may have many different structures. The term "pixel" refers to the smallest unit for displaying an image, and the pixel is arranged in a pixel area. The organic light emitting panel 100 may display an image utilizing a plurality of pixels.

As illustrated in FIGS. 2 and 3, each pixel may include a switching TFT 10, a driving TFT 20, a capacitor 80, and an OLED 140. The components including the switching TFT 10, the driving TFT 20, and the capacitor 80 may be referred to as the driver circuit 130. The driver circuit 130 may further include a gate line 161 arranged along one direction, a data line 171 insulated from and intersecting the gate line 161, and a common power supply line 172. One pixel area may be defined, for example, by the gate line 161, the data line 171, and the common power supply line 172, but may be differently defined. For example, the pixel area may be defined by a black matrix or a pixel defining layer (PDL).

The OLED 140 may include a first electrode 141 serving as an anode, a second electrode 143 serving as a cathode, and a light emitting layer 142 between the first electrode 141 and the second electrode 143. In other implementations, for example, the first electrode 141 may serve as a cathode, and the second electrode 143 may serve as an anode.

When the organic light emitting panel 100 is a top emission display, for example, the first electrode 141 may include a reflective layer and the second electrode 143 may include a translucent layer. When the organic light emitting panel 100 is a bottom emission display, for example, the first electrode 141 may include a translucent layer and the second electrode 143 may include a reflective layer. When the organic light emitting panel 100 is a dual emission display, for example, both of the first electrode 141 and the second electrode 143 may include a transparent layer or a translucent layer.

The reflective layer or translucent layer may include at least one metal selected from magnesium (Mg), silver (Ag), gold (Au), calcium (Ca), lithium (Li), chromium (Cr), and aluminum (Al); and/or a metal alloy of those metals. Whether a layer is a reflective layer or a translucent layer may depend on the thickness of the layer. The translucent layer may have a thickness, for example, of about 200 nm or less. As the thickness of the translucent layer decreases, the transmittance of light passing through the layer may increase. As the thickness of the translucent layer increases, the transmittance of light passing through the layer may decrease. The transparent layer may include indium tin oxide (ITO), indium zinc oxide (IZO), zinc oxide (ZnO), or indium oxide ($In_2O_3$).

The OLED 140 may include the first electrode 141, the light emitting layer 142, and the second electrode 143. At least one of a hole injection layer (HIL) and a hole transporting layer (HTL) may be between the first electrode 141 and the light emitting layer 142. At least one of an electron transporting layer (ETL) and an electron injection layer (EIL) may be between the light emitting layer 142 and the second electrode 143. The OLED 140 may inject holes and electrons into the light emitting layer 142 through the first electrode 141 and the second electrode 143. When excitons generated by combination of the injected holes and electrons fall from an excited state to a ground state, for example, the OLED 140 may emit light.

The capacitor 80 may include a pair of capacitor plates 168 and 178 with an interlayer insulating layer 163 therebetween. The interlayer insulating layer 163 may include a dielectric material. Capacitance of the capacitor 80 may be determined by electric charges stored in the capacitor 80 and voltage between the pair of capacitor plates 168 and 178.

The switching TFT 10 may include a switching semiconductor layer 131, a switching gate electrode 162, a switching source electrode 173, and a switching drain electrode 174. The driving TFT 20 may include a driving semiconductor layer 132, a driving gate electrode 165, a driving source electrode 176, and a driving drain electrode 177. A gate insulating layer 135 may be provided to insulate the gate electrodes 162 and 165 from the semiconductor layers 131 and 132.

The switching TFT 10 may serve as a switching device that selects a pixel to perform light emission. The switching gate electrode 162 may be connected to the gate line 161. The switching source electrode 173 may be connected to the data line 171. The switching drain electrode 174 may be spaced apart from the switching source electrode 173 and connected to one capacitor plate 168.

The driving TFT 20 may apply driving power to the first electrode 141 serving as a pixel electrode, which allows the light emitting layer 142 of the OLED 140 in a selected pixel to emit light. The driving gate electrode 165 may be connected to the capacitor plate 168 connected to the switching drain electrode 174. The driving source electrode 176 and the other capacitor plate 178 may be connected to the common power supply line 172. A planarization layer 164 may be on the TFTs 10 and 20, and the driving drain electrode 177 may be connected to the pixel electrode 141 of the OLED 140 through a contact hole of the planarization layer 164.

The switching TFT 10 may be operated by a gate voltage applied to the gate line 161, and serve to transmit a data voltage (applied to the data line 171) to the driving TFT 20. A voltage equivalent to a differential between a common voltage (applied to the driving TFT 20 from the common power supply line 172) and the data voltage (transmitted from the switching TFT 10) may be stored in the capacitor 80, and a current corresponding to the voltage stored in the capacitor 80 may flow to the OLED 140 through the driving TFT 20, such that the OLED 140 emits light.

The organic light emitting panel 100 may further include a thin film encapsulation layer 150, which is on the flexible substrate 110 and covering the OLED 140. The thin film encapsulation layer 150 may include one or more inorganic layers 151, 153, and 155, and one or more organic layers 152 and 154. The thin film encapsulation layer 150 may have a laminated structure in which the inorganic layers 151, 153, and 155 and the organic layers 152 and 154 are alternately laminated. The inorganic layer 151 may be the lowermost layer. The inorganic layer 151 may be the closest to the OLED 140. The thin film encapsulation layer 150 may include, for example, three inorganic layers 151, 153, and 155 and two organic layers 152 and 154 in FIG. 3. Different numbers of inorganic layers and/or organic layers may be used.

The inorganic layers 151, 153, and 155 may include one or more inorganic substances selected from $Al_2O_3$, $TiO_2$, $ZrO$, $SiO_2$, AlON, AlN, SiON, $Si_3N_4$, ZnO, and $Ta_2O_5$. The inorganic layers 151, 153, and 155 may be formed, for example, by utilizing a chemical vapor deposition (CVD) method or an atomic layer deposition (ALD) method. In other implementations, for example, the inorganic layers 151, 153, and 155 may be formed by utilizing many different suitable methods.

The organic layers 152 and 154 may include a polymer material. Examples of the polymer material include acrylic resin, epoxy resin, polyimide, polyethylene, and the like. The organic layers 152 and 154 may be formed, for example, through a thermal deposition process. The thermal deposition process for forming the organic layers 152 and 154 may be performed at a temperature at which the OLED 140 is not likely to be damaged. Other processes may be used in addition to or in the alternative to a thermal deposition process. In other implementations, for example, the organic layers 152 and 154 may be formed by utilizing one or more different suitable methods.

The inorganic layers 151, 153, and 155, which may have high density, may suppress the infiltration of moisture or oxygen. The infiltration of moisture or oxygen into the OLED 140 may be reduced or prevented by the inorganic layers 151, 153, and 155. The thin film encapsulation layer 150 may have a thickness of about 10 μm or less. Accordingly, a flexible display device may be small in its total thickness. With the thin film encapsulation layer 150 included in the flexible display device, for example, flexibility of the flexible display device may be increased.

Figure 4:
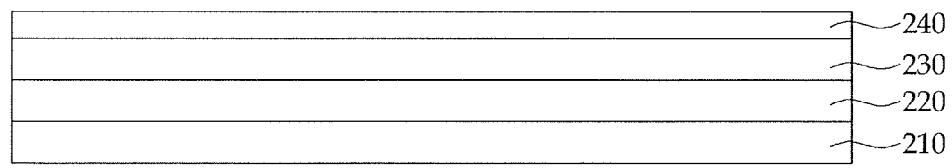
FIG. 4 illustrates a cross-sectional view of a cushion pad included in the display device illustrated in FIG. 1.

The cushion pad 200 is described with reference to FIG. 4. The cushion pad 200 may include a metal layer 210, a hard material layer 220 on the metal layer 210 and have a hardness higher than a hardness of the metal layer 210, and a hardness of an elastic layer 230 on the hard material layer 220. The cushion pad 200 may further include an adhesive layer 240 on the elastic layer 230. When the cushion pad 200 is provided with the display panel 100, for example, the elastic layer 230 may be proximal the display panel 100 and the metal layer 210 may be distal the display panel 100 with respect to the hard material layer 220.

The metal layer 210 may be selected from metals having high ductility. The metal layer 210 may be selected from metals having low hardness on the Mohs scale. For example, the metal layer 210 may include a metal having a hardness of less than about 4.5 on the Mohs scale. For example, the metal layer 210 may include at least one of aluminum having a hardness of 2-2.5, gold having a hardness of 2.5-3, silver having a hardness of 2.5-3, copper having a hardness of 2.5-3, zinc having a hardness of 4, and lead having a hardness of 1-2 on the Mohs scale.

The metal layer 210 may be adjacent to the lower case 320, and when foreign matter is introduced into the lower case 320, for example, the metal layer 210 may collect the foreign matter. The metal layer 210 may be changed in shape corresponding to volume of foreign matter 403 and 404 present in the lower case 320 so as to collect the foreign matter 403 and 404. When the metal layer 210 has a hardness of about 4.5 or more on the Mohs scale, for example, it might not be sufficiently changed corresponding to the foreign matter 403 and 404, and thus may fail to collect the foreign matter 403 and 404. As a result, the foreign matter 403 and 404 may lead to lifting of the cushion pad 200. The metal layer 210 may have a thickness, for example in a range of from about 50 μm to about 100 μm. If the metal layer 210 is too thin, it may not be sufficient to collect the foreign matter 403 and 404. If the metal layer 210 is too thick, it may undesirably increase the thickness of the display device.

The hard material layer 220 may have a hardness, for example of about 4.5 or more on the Mohs scale. The hard material layer 220 may include metals or alloys of the metals, or may include hard plastic or graphite-based materials. For example, the hard material layer 220 may include carbon steel or stainless steel that has a hardness of 5 to 6 on the Mohs scale. The hard material layer 220 may have a thickness in a range of from about 50 μm to about 100 μm. If the hard material layer 220 is too thin, it may be easily deformed such that foreign matter is visible in the display panel 100. If the hard material layer 220 is too thick, it may undesirably increase the display thickness.

The elastic layer 230 may include polymer resins. Examples of the polymer resins that may be used for the elastic layer 230 include acrylic resin, epoxy resin, urethane resin, urethane acrylate resin, rubber resin, polyimide resin, polyethylene resin, and fiber reinforced plastic (FRP). The elastic layer 230 may have a thickness in a range of from about 80 μm to about 200 μm. If the elastic layer 230 is too thin, it may be difficult to fully protect the display device and the display panel 100 from impact. If the elastic layer 230 is too thick, it may undesirably increase the display thickness. The elastic layer 230 may have a hardness of from about 0.1 to about 1.5 on the Mohs scale. The elastic layer 230 may have a lower hardness than a hardness of the display panel 100 so as to absorb stress caused by foreign matter. The elastic layer 230 may have lower hardness than the metal layer 210 and the hard material layer 220.

The adhesive layer 240 may bond the cushion pad 200 to the display panel 100. The adhesive layer 240 may be transparent, translucent, or opaque. The adhesive layer 240 may include, for example, one or more of an acrylic adhesive, a urethane adhesive, an epoxy adhesive, a urethane acrylate adhesive, and a rubber adhesive. The adhesive layer 240 may have a thickness in a range of from about 30 μm to about 50 μm. If the adhesive layer 240 is too thin, its adhesive strength may decrease. If the adhesive layer 240 is too thick, it may undesirably increase the thickness of the device. The adhesive layer 240 may be between the metal layer 210 and the hard material layer 220, and also between the hard material layer 220 and the elastic layer 230. The adhesive layer 240 between the metal layer 210 and the hard material layer 220, and also between the hard material layer 220 and the elastic layer 230 may have, for example, a thickness of about 50 μm or less.

Figure 5:
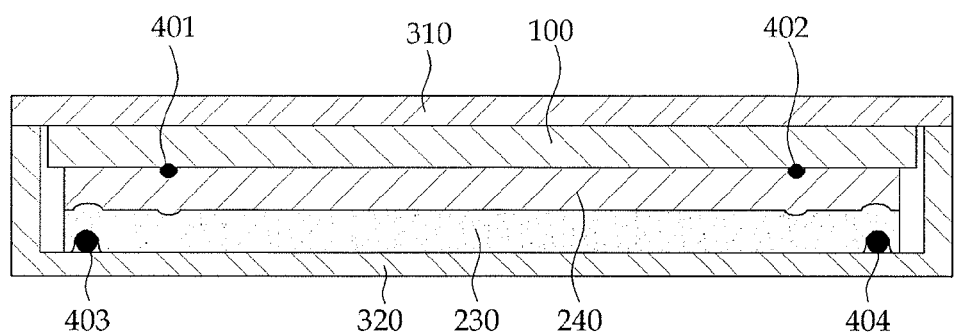
FIG. 5 illustrates a cross-sectional view of foreign matter introduced into a display device.

FIG. 5 illustrates a cross-sectional view of foreign matter 401, 402, 403, and 404 introduced into a display device. In FIG. 5, the foreign matter 401 and 402 may be introduced between the adhesive layer 240 and the display panel 100, and also between the elastic layer 230 and the lower case 320. Referring to FIG. 5, the display panel 100 may be deformed or damaged due to the foreign matter 401 and 402, thereby deteriorate the moisture proofing capability of the flexible substrate 110. Moisture infiltration into the display panel 100 may cause damage to the OLED 140 acting as a display element or the driver circuit 130. When the foreign matter 403 and 404 is introduced between the elastic layer 230 and the lower case 320, for example, the elastic layer 230 may be changed in shape in accordance with the volume of the foreign matter 403 and 404. When the elastic layer 230 is deformed due to the foreign matter 403 and 404, for example, the foreign matter 403 and 404 may be visible from the front surface of the display panel 100.

Figure 6:
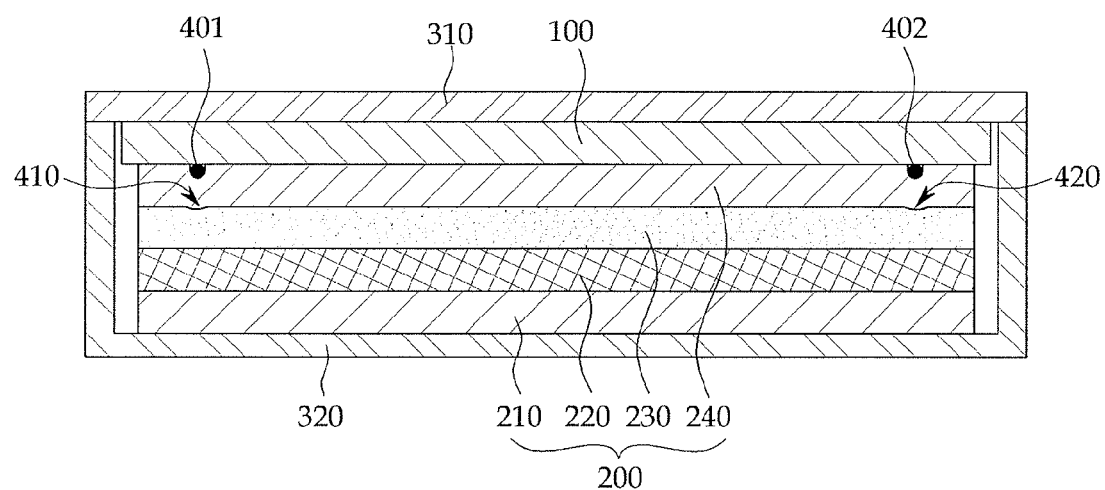
FIG. 6 illustrates a cross-sectional view of foreign matter introduced into a display device according to an embodiment.

FIG. 6 illustrates a cross-sectional view of foreign matter introduced into a display device according to an embodiment. The foreign matter 401 and 402 may be introduced, for example, in the process of bonding the display panel 100 and the cushion pad 200.

Referring to FIG. 6, the cushion pad 200 may further include the hard material layer 220 and the metal layer 210 as compared to the cushion pad illustrated in FIG. 5. The elastic layer 230 need not contact directly the lower case 320 having high hardness, but may contact the hard material layer 220 that is somewhat elastic, and the metal layer 210 may contact the lower case 320. Cushion effects on the deformation caused by the foreign matter 401 and 402 may be improved.

Although the foreign matter 401 and 402 may be introduced between the display panel 100 and the adhesive layer 240 of the cushion pad 200, the elastic layer 230 may absorb deformation 410 and 420 of the adhesive layer 240, which is attributable to the foreign matter 401 and 402. The deformation of the display panel 100 decreases such that the foreign matter 401 and 402 may be easily collected by the elastic layer 230 and the adhesive layer 240. The display panel 100 need not be deformed due to the foreign matter 401 and 402, and the foreign matter 401 and 402 may be prevented from being visible from the front surface of the display device.

Figure 7:
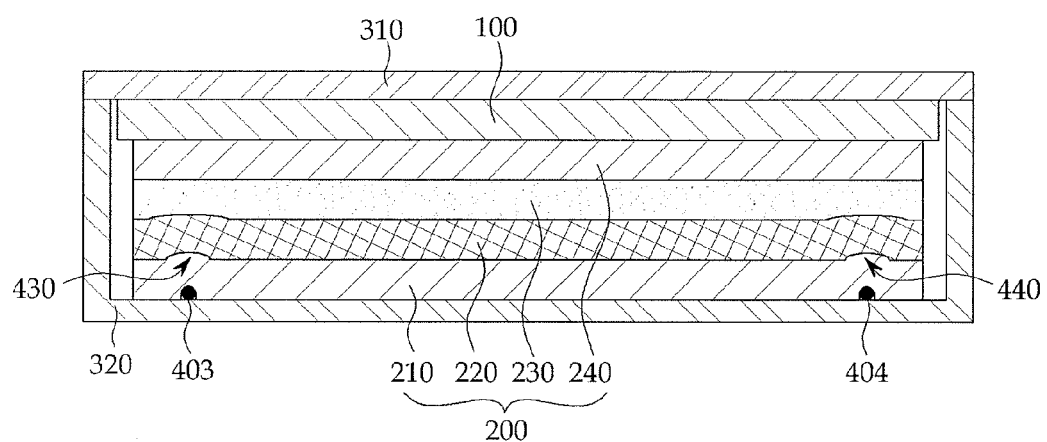
FIG. 7 illustrates a cross-sectional view of other foreign matter introduced into a display device according to an embodiment.

FIG. 7 illustrates a cross-sectional view of other foreign matter introduced into a display device. When the foreign matter 403 and 404 is introduced between the cushion pad 200 and the lower case 320, for example, the lower case 320 need not be deformed, but the metal layer 210, which is a lower portion of the cushion pad 200, may be deformed corresponding to the volume of the foreign matter 403 and 404. The metal layer 210 may have lower hardness than the hard material layer 220, and thus the deformation of the metal layer 210 may be large, whereas the deformation of the hard material layer 220 is not as large as that of the metal layer 210. The elastic layer 230 and the adhesive layer 240, which are above the hard material layer 220, may be hardly deformed by the foreign matter 403 and 404. The hard material layer 220 may absorb the deformation 430 and 440 of the metal layer 210, and thus the foreign matter 403 and 404 need not be visible from the front surface of the display device. When any one of the metal layer 210, the hard material layer 220, the elastic layer 230, and the adhesive layer 240 is not transparent, for example, the foreign matter 403 and 404 need not be visible from the front surface of the display device.

By way of summation and review, a flexible display device may have a flexible display panel mounted in an accommodating space of a case. However, when a display panel is mounted in a case, foreign matter may be introduced between the display panel and the case. A flexible substrate may be deformed due to the foreign matter or the foreign matter may be visible from the display panel. If the foreign matter is introduced when the display panel is mounted in the case, i.e., if foreign matter does infiltrate, deformation of the flexible substrate due to the foreign matter may have deleterious consequences.

In contrast, embodiments disclosed herein are capable of preventing deformation of a flexible substrate due to foreign matter even though the foreign matter is introduced into a case. That is, embodiments described herein may prevent the deformation of a flexible substrate by the foreign matter that may be introduced between a case and a display panel. Embodiments described herein may also prevent or reduce the visibility of foreign matter from the front surface of the display panel. According to various embodiments, a display device may include a cushion pad in which a metal layer having low hardness and a hard material layer having high hardness are sequentially laminated. Further, embodiments are directed toward a cushion pad that may be applied to a display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it is understood by those of skill in the art that various changes in form and details may be made without departing from the spirit and scope of the present disclosure as set forth in the following claims.

What is claimed is:

1. A display device comprising:
a case having an accommodating space;
a cushion pad in the accommodating space of the case; and
a display panel on the cushion pad that is outside of the display panel, wherein the cushion pad includes:
a metal layer,
a hard material layer on the metal layer, the hard material layer having a hardness greater than a hardness of the metal layer,
an elastic layer on the hard material layer, and
an adhesive layer between the elastic layer and the display panel, wherein
the elastic layer is in a plate shape, the elastic layer having a predetermined thickness range.

2. The display device as claimed in claim 1, wherein the elastic layer has a hardness lower than a hardness of the display panel.

3. The display device as claimed in claim 2, wherein the elastic layer has a hardness range of about 0.1 to 1.5 on Mohs hardness scale.

4. The display device as claimed in claim 1, wherein the elastic layer has a hardness lower than the hardness of the hard material layer.

5. The display device as claimed in claim 1, wherein the metal layer has a hardness of less than about 4.5 on Mohs hardness scale.

6. The display device as claimed in claim 1, wherein the metal layer includes at least one of aluminum, gold, silver, copper, zinc, and lead.

7. The display device as claimed in claim 1, wherein the hard material layer has a hardness of about 4.5 or more on Mohs hardness scale.

8. The display device as claimed in claim 1, wherein the hard material layer includes carbon steel.

9. The display device as claimed in claim 1, wherein the hard material layer includes stainless steel.

10. The display device as claimed in claim 1, wherein the elastic layer includes polymer resins.

11. The display device as claimed in claim 1, wherein the elastic layer of the cushion pad faces the display panel and is proximate thereto.

12. The display device as claimed in claim 1, wherein the predetermined thickness range of the elastic layer is about 80 μm to 200 μm.

13. The display device as claimed in claim 1, wherein the elastic layer is an electric insulator.

14. The display device as claimed in claim 1, wherein the display panel includes a substrate and a plurality of pixels on the substrate, and wherein the substrate of the display panel is between the plurality of pixel of the display panel and the adhesive layer.

15. A cushion pad for supporting a display panel comprising:
a metal layer;
a hard material layer on the metal layer, the hard material layer having a hardness greater than a hardness of the metal layer;
an elastic layer on the hard material layer; and
an adhesive layer, to bond the cushion pad to the display panel, on the elastic layer, wherein
the elastic layer is in a plate shape, the elastic layer having a predetermined thickness range.

16. The cushion pad as claimed in claim 15, wherein the metal layer has a hardness of less than about 4.5 on the Mohs scale.

17. The cushion pad as claimed in claim 15, wherein the metal layer includes at least one of aluminum, gold, silver, copper, zinc, and lead.

18. The cushion pad as claimed in claim 15, wherein the hard material layer has a hardness of about 4.5 or more on Mohs hardness scale.

19. The cushion pad as claimed in claim 15, wherein the hard material layer includes carbon steel.

20. The cushion pad as claimed in claim 15, wherein the hard material layer includes stainless steel.

21. The cushion pad as claimed in claim 15, wherein the elastic layer includes polymer resins.

22. The cushion pad as claimed in claim 15, further comprising an adhesive layer on the elastic layer.

\* \* \* \* \*